(12) United States Patent
Shishido et al.

(10) Patent No.: US 8,614,139 B2
(45) Date of Patent: Dec. 24, 2013

(54) DICING FILM WITH PROTECTING FILM

(75) Inventors: Yuichiro Shishido, Ibaraki (JP); Takeshi Matsumura, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/415,524

(22) Filed: Mar. 8, 2012

(65) Prior Publication Data

US 2012/0231236 A1 Sep. 13, 2012

(30) Foreign Application Priority Data

Mar. 11, 2011 (JP) ................................. 2011-054304

(51) Int. Cl.
*H01L 21/46* (2006.01)

(52) U.S. Cl.
USPC ............ 438/460; 438/114; 438/464; 438/465

(58) Field of Classification Search
USPC ......... 438/458, 460, 462, 463, 464, 465, 113, 438/114
See application file for complete search history.

(56) References Cited

U.S. PATENT DOCUMENTS

| | | | |
|---|---|---|---|
| 4,961,804 A | 10/1990 | Aurichio | |
| 6,777,310 B2* | 8/2004 | Inuzuka | 438/460 |
| 7,935,574 B2* | 5/2011 | Saiki et al. | 438/113 |
| 2008/0185700 A1* | 8/2008 | Takamatsu et al. | 257/678 |
| 2009/0261039 A1 | 10/2008 | Tanaka et al. | |
| 2010/0219507 A1* | 9/2010 | Misumi et al. | 257/618 |
| 2010/0227165 A1* | 9/2010 | Maruyama et al. | 428/355 EN |
| 2010/0236689 A1 | 9/2010 | Amano et al. | |
| 2012/0261839 A1* | 10/2012 | Takamoto et al. | 438/464 |

FOREIGN PATENT DOCUMENTS

| | | |
|---|---|---|
| JP | 60-57642 | 4/1985 |
| JP | 07-195527 | 8/1995 |
| JP | 10-053746 | 2/1998 |
| JP | 2003-109916 | 4/2003 |
| JP | 2004-142430 | 5/2004 |

(Continued)

OTHER PUBLICATIONS

Notification of Reasons for Refusal dated Jan. 10, 2012 in corresponding Japanese patent application No. 2011-054304.

(Continued)

*Primary Examiner* — Kevin M Picardat
(74) *Attorney, Agent, or Firm* — Knobbe Martens Olson & Bear LLP

(57) ABSTRACT

The present invention provides a dicing film with a protecting film that enables to paste a dicing film to a semiconductor wafer without a shift in position while reducing a downtime. There is provided a dicing film with a protecting film in which a dicing film and a protecting film are laminated, wherein the difference between the transmittance of the protecting film and the transmittance of the dicing film with a protecting film at a portion of the dicing film where light for detecting a film transmits first is 20% or more in a wavelength of 600 to 700 nm.

2 Claims, 2 Drawing Sheets

(56) References Cited

FOREIGN PATENT DOCUMENTS

| JP | 2004-266163 | 9/2004 |
| JP | 2006-111727 | 4/2006 |
| JP | 2006-186305 | 7/2006 |
| JP | 2009-016538 | 1/2009 |
| JP | 2009-059917 | 3/2009 |
| JP | 2010-056407 | 3/2010 |
| JP | 2010-265416 | 11/2010 |
| JP | 2011-023692 | 2/2011 |
| JP | 2011-111530 | 6/2011 |
| JP | 2011-129786 | 6/2011 |
| JP | 2011-171545 | 9/2011 |

OTHER PUBLICATIONS

Prior Art Search (for Expedited Examination) in corresponding Korean patent application No. 10-2012-0024293, filed Mar. 9, 2012.

* cited by examiner

DICING FILM WITH PROTECTING FILM

This application claims priority to Japanese Patent Application No. 2011-054304, filed Mar. 11, 2011. The above-referenced application is hereby expressly incorporated by reference in its entirety.

BACKGROUND OF THE INVENTION

1. Field of the Invention

The present invention relates to a dicing film with a protecting film.

2. Description of the Related Art

Conventionally, a semiconductor wafer is manufactured to have a large area in advance, diced into chips (separation by cutting), and transferred to an expanding step. A dicing film is used to fix the semiconductor wafer when dicing.

The semiconductor wafer that is fixed to the dicing film is diced into chips, and expanded uniformly in the surface direction on an expansion ring to separate each chip, and then the chips are picked up.

A dicing film has been conventionally proposed in Japanese Patent Application Laid-Open No. 60-57642, that adheres and holds a semiconductor wafer in a dicing step and also yields an adhesive layer for fixing a chip that is necessary in a mounting step.

The dicing film described above is cut into a circle, etc. to match the size of the semiconductor wafer, and is arranged on a long protecting film at prescribed intervals. The dicing film is peeled from the protecting film using a wafer mounting apparatus, etc., and at the same time pasted to the semiconductor wafer. In the wafer mounting apparatus, it is determined that the dicing film is detected when the light transmittance for film detection changes, that is, when the light transmittance changes from the transmittance of only the protecting film to the total transmittance of the protecting film and the dicing film, and the semiconductor wafer is pasted to the dicing film so that no shift in position occurs by using the position of the dicing film detected as a standard position of the dicing film.

SUMMARY OF THE INVENTION

However, conventionally, there has been a problem that a downtime occurs by a dicing film that cannot be detected on a protecting film, is transferred as it is, and is not used in a wafer mounting apparatus. In addition, there has been a problem that the semiconductor wafer is pasted to the dicing film which is being shifted in position due to a delay in detection.

The present invention has been made in view of the above-described problem points, and an object thereof is to provide a dicing film with a protecting film that enables to paste a dicing film to a semiconductor wafer without a shift in position while reducing the downtime.

The present inventors investigated a dicing film with a protecting film to solve the conventional problem points. As a result, it was found that a dicing film can be pasted to a semiconductor wafer without a shift in position while reducing the downtime by adopting the following configuration, and the present invention was completed.

That is, a dicing film with a protecting film according to the present invention is a dicing film with a protecting film in which a dicing film and a protecting film are laminated, and is characterized in that the difference between the transmittance of the protecting film and the transmittance of the dicing film with a protecting film at a portion of the dicing film where light for detecting a film transmits first is 20% or more in a wavelength of 600 to 700 nm.

According to the above-described configuration, since the difference between the transmittance of the protecting film and the transmittance of the dicing film with a protecting film at the portion of the dicing film where the light for detecting a film transmits first is 20% or more in a wavelength of 600 to 700 nm, a sensor to detect the light for detecting a film can reliably detect a change of the transmittance of only a protecting film to the transmittance of a dicing film with a protecting film that includes a dicing film. As a result, it can be prevented that a non-detected dicing film is transferred and not used, and the downtime during this process can be eliminated. In addition, it can be prevented that a semiconductor wafer is pasted to a dicing film which is being shifted in position, and the dicing film can be pasted to the semiconductor wafer without a shift in position.

In the above-described configuration, the dicing film has a base and an adhesive layer that is laminated on the base, and embossing is preferably performed on the base. When the embossing is performed on the base, the difference between the transmittance of only the protecting film and the transmittance of the dicing film with a protecting film can be more reliably 20% or more.

In the above-described configuration, the dicing film has a base and an adhesive layer that is laminated on the base, and the base is preferably colored. When the base is colored, the difference between the transmittance of only the protecting film and the transmittance of the dicing film with a protecting film can be more reliably 20% or more.

In the above-described configuration, the transmittance of the dicing film with a protecting film at the portion of the dicing film where the light for detecting a film transmits first is preferably 0 to 70%. When the transmittance is 0 to 70%, the difference in transmittances can be easily made to be 20% or more.

In the above-described configuration, the transmittance of the protecting film is preferably 75 to 100%. When the transmittance is 75 to 100%, the difference in transmittances can be easily made to be 20% or more.

In the above-configuration, a die bond film is preferably laminated on the adhesive layer of the dicing film. When the die bond film is preferably laminated on the adhesive layer of the dicing film, a step of pasting the die bond film can be omitted, and the productivity can be improved.

EXPLANATION OF THE REFERENCE NUMERALS

1 BASE
2 ADHESIVE LAYER
3 DIE BOND FILM
4 SEMICONDUCTOR WAFER
5 SEMICONDUCTOR CHIP
6 ADHEREND
7 BONDING WIRE

8 SEALING RESIN
10, 20 DICING FILM WITH PROTECTING FILM
11 DICING FILM
14 PROTECTING FILM
15 PRINTING LAYER

DESCRIPTION OF THE PREFERRED EMBODIMENTS (Dicing Film with Protecting Film)

Figure 1:
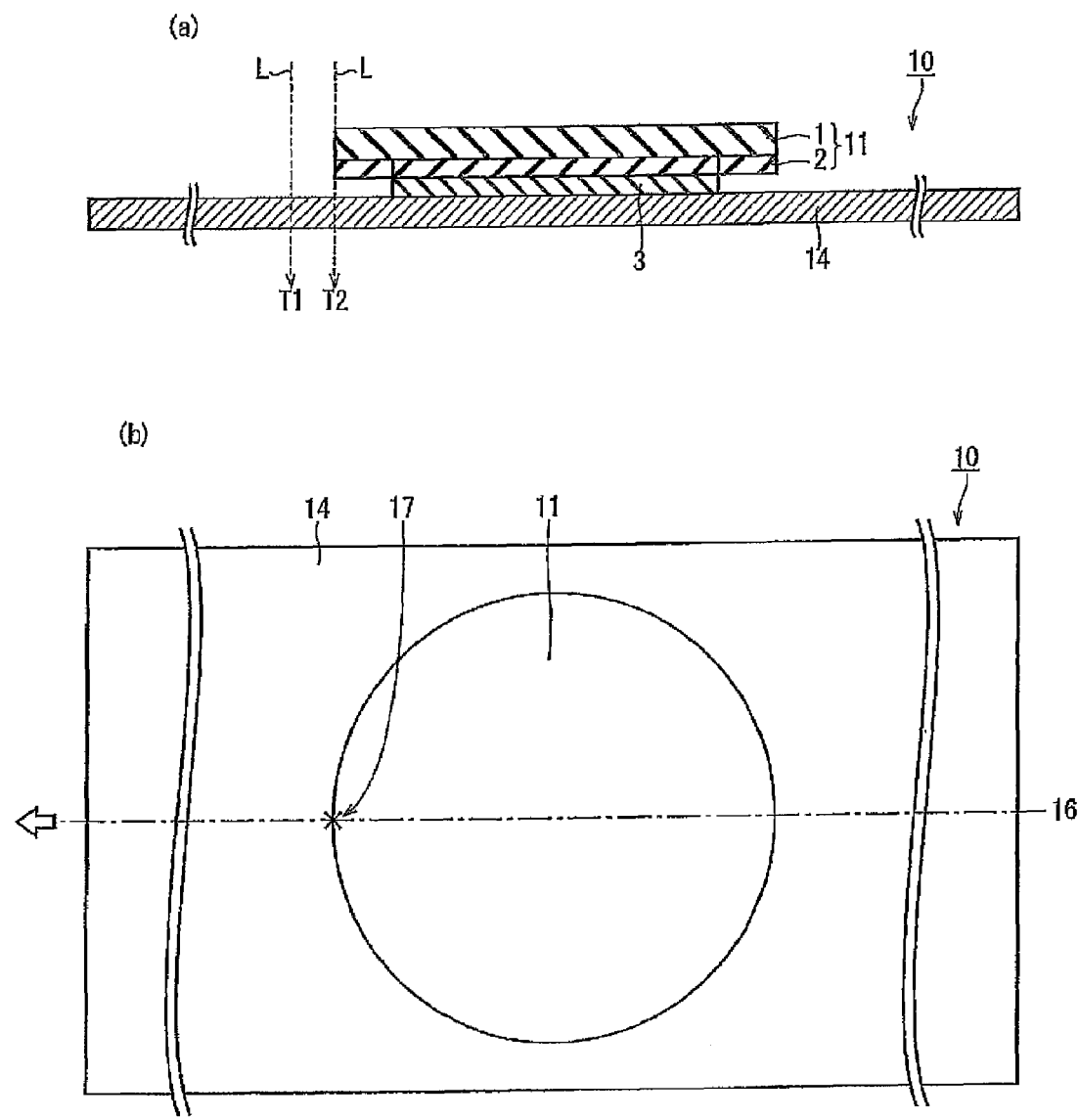
FIG. 1A is a schematic cross section view showing a dicing film with a protecting film according to one embodiment of the present invention.
FIG. 1B is a plan view showing the same.
Figure 2:
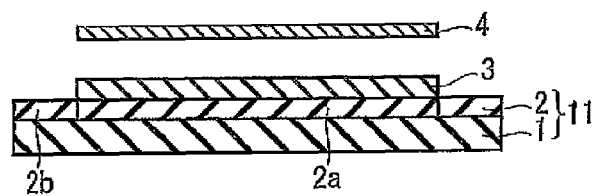
FIG. 2 is a schematic cross section view showing a part of the dicing film with a protecting film of FIGS. 1A and 1B.

A dicing film with a protecting film according to one embodiment of the present invention is explained below. FIG. 1A is a schematic cross section view showing a dicing film with a protecting film according to one embodiment of the present invention. FIG. 1B is a plan view showing the same. FIG. 2 is a schematic cross section view showing a part of the dicing film with a protecting film of FIGS. 1A and 1B.

As shown in FIGS. 1A and 1B, a dicing film with a protecting film 10 has a configuration in which a dicing film 11 that is circular in plan view is laminated on a long protecting film 14. The dicing film 11 is configured by laminating an adhesive layer 2 on a base 1, and a die bond film 3 having a smaller diameter than that of the dicing film 11 is laminated on the adhesive layer 2. The dicing film 11 is laminated on the protecting film 14 so as to face the adhesive layer 2 and the die bond film 3. In the present invention, the die bond film is not necessary to be laminated.

The dicing film with a protecting film 10 is moved in a fixed direction (to the left in FIG. 1B) and a center portion 16 in the width direction of the protecting film 14 of the dicing film with a protecting film 10 is irradiated with light L for detecting a film in a process of manufacturing a semiconductor device. At this time, the difference between the transmittance T1 (refer to FIG. 1A) of the protecting film 14 and the transmittance T2 (refer to FIG. 1A) of the dicing film with a protecting film 10 at a portion 17 of the dicing film 11 where light L transmits first (in the present embodiment, it is the portion where the protecting film 14 and the dicing film 11 are laminated) is 20% or more in a wavelength of 600 to 700 nm. The difference in transmittances is preferably 20 to 40%, and more preferably 30 to 40%. Because the difference in transmittances is 20% or more, a sensor to detect the light for detecting a film can reliably recognize a change from the transmittance T1 of only the protecting film 14 to the transmittance T2 of a portion where the protecting film 14 and the dicing film 11 are laminated. As a result, it can be prevented that a non-detected dicing film is transferred and not used, and the downtime during this process can be eliminated. In addition, the dicing film can be pasted to the semiconductor wafer without a shift in position.

The transmittance T1 is preferably 75 to 100%, more preferably 80 to 100%, and further preferably 85 to 100%. When the transmittance T1 is 75 to 100%, the difference in transmittances can be easily made to be 20% or more.

The transmittance T2 is preferably 0 to 70%, more preferably 0 to 65%, and further preferably 0 to 65%. When the transmittance T2 is 0 to 70%, the difference in transmittances can be easily made to be 20% or more.

The base 1 preferably has ultraviolet ray transparency, and is one which serves as a strength base of the dicing film 11. Examples thereof include polyolefin such as low-density polyethylene, straight chain polyethylene, intermediate-density polyethylene, high-density polyethylene, very low-density polyethylene, random copolymer polypropylene, block copolymer polypropylene, homopolypropylene, polybutene, and polymethylpentene; an ethylene-vinylacetate copolymer; an ionomer resin; an ethylene(meth)acrylic acid copolymer; an ethylene(meth)acrylic acid ester (random or alternating) copolymer; an ethylene-butene copolymer; an ethylene-hexene copolymer; polyurethane; polyester such as polyethyleneterephthalate and polyethylenenaphthalate; polycarbonate; polyetheretherketone; polyimide; polyetherimide; polyamide; whole aromatic polyamides; polyphenylsulfide; aramid (paper); glass; glass cloth; a fluorine resin; polyvinyl chloride; polyvinylidene chloride; a cellulose resin; a silicone resin; metal (foil); and paper.

Further, the material of the base 1 includes a polymer such as a cross-linked body of the above resins. The above plastic film may be also used unstreched, or may be also used on which a monoaxial or a biaxial stretching treatment is performed depending on necessity. According to resin sheets in which heat shrinkable properties are given by the stretching treatment, etc., the adhesive area of the adhesive layer 2 and the die bond film 3 is reduced by thermally shrinking the base 1 after dicing, and the recovery of the semiconductor chips (a semiconductor element) can be facilitated.

The base 1 is preferably colored. When the base 1 is colored, the difference between the transmittance T1 of only the protecting film 14 and the transmittance T2 of the portion 11 where the protecting film 14 and the dicing film are laminated can be made to be more reliably 20% or more. When the base 1 is colored, a coloring material (a coloring agent) can be used depending on the intended light transmittance. Various dark coloring materials such as black coloring materials, blue coloring materials, and red coloring materials can be suitably used, and the black coloring materials are especially suitable. The coloring material may be any of a pigment, a dye, and the like. The coloring material can be used alone or two types or more can be combined and used. Any of acid dyes, reactive dyes, direct dyes, disperse dyes, cation dyes, and the like can be used. In addition, the form of the pigment is not especially limited, and it can be appropriately selected from known pigments and used.

Especially, when a dye is used as the coloring material, the base 1 having a uniform coloring concentration can be easily manufactured because the dye is dispersed in the base 1 uniformly or almost uniformly by dissolution.

The black color material is not especially limited, and can be appropriately selected from inorganic black pigments and black dyes, for example. The black color material may be a color material mixture in which a cyan color material (blue-green color material), a magenta color material (red-purple color material), and a yellow color material are mixed together. The black color materials can be used alone or two types or more can be used together. The black color materials can be used also with other color materials other than black.

Specific examples of the black color materials include carbon black such as furnace black, channel black, acetylene black, thermal black, and lamp black, graphite (black lead), copper oxide, manganese dioxide, azo pigments such as azomethine azo black, aniline black, perylene black, titanium black, cyanine black, activated carbon, ferrite such as non-magnetic ferrite and magnetic ferrite, magnetite, chromium oxide, iron oxide, molybdenum disulfide, chromium complex, complex oxide black, and anthraquinone organic black.

In the present invention, black dyes such as C. I. solvent black 3, 7, 22, 27, 29, 34, 43, and 70, C. I. direct black 17, 19, 22, 32, 38, 51, and 71, C. I. acid black 1, 2, 24, 26, 31, 48, 52, 107, 109, 110, 119, and 154, and C. I. disperse black 1, 3, 10, and 24; and black pigments such as C. I. pigment black 1 and 7 can be used as the black color material.

Examples of such black color materials that are available on the market include Oil Black BY, Oil Black BS, Oil Black HBB, Oil Black 803, Oil Black 860, Oil Black 5970, Oil Black 5906, and Oil Black 5905 manufactured by Orient Chemical Industries Co., Ltd.

Examples of color materials other than the black color materials include a cyan color material, a magenta color material, and a yellow color material. Examples of the cyan color material include cyan dyes such as C. I. solvent blue 25, 36, 60, 70, 93, and 95; and C. I. acid blue 6 and 45; and cyan pigments such as C. I. pigment blue 1, 2, 3, 15, 15:1, 15:2, 15:3, 15:4, 15:5, 15:6, 16, 17, 17:1, 18, 22, 25, 56, 60, 63, 65, and 66; C. I. vat blue 4 and 60; and C. I. pigment green 7.

Examples of the magenta color material include magenta dyes such as C. I. solvent red 1, 3, 8, 23, 24, 25, 27, 30, 49, 52, 58, 63, 81, 82, 83, 84, 100, 109, 111, 121, and 122; C. I. disperse red 9; C. I. solvent violet 8, 13, 14, 21, and 27; C. I. disperse violet 1; C. I. basic red 1, 2, 9, 12, 13, 14, 15, 17, 18, 22, 23, 24, 27, 29, 32, 34, 35, 36, 37, 38, 39, and 40; and C. I. basic violet 1, 3, 7, 10, 14, 15, 21, 25, 26, 27, and 28.

Examples of the magenta color material include magenta pigments such as C. I. pigment red 1, 2, 3, 4, 5, 6, 7, 8, 9, 10, 11, 12, 13, 14, 15, 16, 17, 18, 19, 21, 22, 23, 30, 31, 32, 37, 38, 39, 40, 41, 42, 48:1, 48:2, 48:3, 48:4, 49, 49:1, 50, 51, 52, 52:2, 53:1, 54, 55, 56, 57:1, 58, 60, 60:1, 63, 63:1, 63:2, 64, 64:1, 67, 68, 81, 83, 87, 88, 89, 90, 92, 101, 104, 105, 106, 108, 112, 114, 122, 123, 139, 144, 146, 147, 149, 150, 151, 163, 166, 168, 170, 171, 172, 175, 176, 177, 178, 179, 184, 185, 187, 190, 193, 202, 206, 207, 209, 219, 222, 224, 238, and 245; C. I. pigment violet 3, 9, 19, 23, 31, 32, 33, 36, 38, 43, and 50; and C. I. vat red 1, 2, 10, 13, 15, 23, 29, and 35.

Examples of the yellow color material include yellow dyes such as C. I. solvent yellow 19, 44, 77, 79, 81, 82, 93, 98, 103, 104, 112, and 162; and yellow pigments such as C. I. pigment orange 31 and 43, C. I. pigment yellow 1, 2, 3, 4, 5, 6, 7, 10, 11, 12, 13, 14, 15, 16, 17, 23, 24, 34, 35, 37, 42, 53, 55, 65, 73, 74, 75, 81, 83, 93, 94, 95, 97, 98, 100, 101, 104, 108, 109, 110, 113, 114, 116, 117, 120, 128, 129, 133, 138, 139, 147, 150, 151, 153, 154, 155, 156, 167, 172, 173, 180, 185, and 195, and C. I. vat yellow 1, 3, and 20.

Various color materials such as cyan color materials, magenta color materials, and yellow color materials can be used alone or two types or more can be used together. When two or more types of various coloring materials such as cyan coloring materials, magenta coloring materials, and yellow coloring materials are used, the mixing ratio (or the compounding ratio) of these coloring materials is not especially limited, and it can be appropriately selected depending on the types of each coloring material, the intended light transmittance, and the like.

The embossing is preferably performed on the surface of the base 1. When the embossing is performed on the base 1, the difference between the transmittance T1 of only the protecting film 14 and the transmittance T2 of the portion where the protecting film 14 and the dicing film 11 are laminated can be more reliably 20% or more. Examples of an embossing method include a method of accompanying a film to an emboss roll, a method of processing with a sand mat, and a method of chemically treating by etching or the like. An example of the standard of the embossing includes a haze value. The haze value of the surface of the base 1 is preferably 10 to 100%, more preferably 20 to 100%, and further preferably 30 to 100%. By making the haze value of the surface of the base 1 to be 10 to 100%, the difference between the transmittance T1 and the transmittance T2 can be reliably made to be 20% or more.

A known surface treatment such as a chemical or physical treatment such as a chromate treatment, ozone exposure, flame exposure, high voltage electric exposure, and an ionized ultraviolet treatment, and a coating treatment by an undercoating agent (for example, a tacky substance described later) can be performed on the surface of the base 1 in order to improve adhesiveness, holding properties, etc. with the adjacent layer. The same type or different type of base material can be appropriately selected and used as the base 1, and a base material in which a plurality of types are blended can be used depending on necessity.

The thickness of the substrate 1 can be appropriately determined without any special limitation. The thickness is generally about 5 to 200 μm.

The adhesive that is used for forming the adhesive layer 2 is not especially limited, and general pressure-sensitive adhesives such as an acrylic pressure-sensitive adhesive and a rubber pressure-sensitive adhesive can be used, for example. The pressure-sensitive adhesive is preferably an acrylic pressure-sensitive adhesive containing an acrylic polymer as a base polymer in view of clean washing of electronic components such as a semiconductor wafer and glass, which are easily damaged by contamination, with ultrapure water or an organic solvent such as alcohol.

Specific examples of the acryl polymers include an acryl polymer in which acrylate is used as a main monomer component. Examples of the acrylate include alkyl acrylate (for example, a straight chain or branched chain alkyl ester having 1 to 30 carbon atoms, and particularly 4 to 18 carbon atoms in the alkyl group such as methylester, ethylester, propylester, isopropylester, butylester, isobutylester, sec-butylester, t-butylester, pentylester, isopentylester, hexylester, heptylester, octylester, 2-ethylhexylester, isooctylester, nonylester, decylester, isodecylester, undecylester, dodecylester, tridecylester, tetradecylester, hexadecylester, octadecylester, and eicosylester) and cycloalkyl acrylate (for example, cyclopentylester, cyclohexylester, etc.). These monomers may be used alone or two or more types may be used in combination. All of the words including "(meth)" in connection with the present invention have an equivalent meaning.

The acrylic polymer may optionally contain a unit corresponding to a different monomer component copolymerizable with the above-mentioned alkyl ester of (meth)acrylic acid or cycloalkyl ester thereof in order to improve the cohesive force, heat resistance or some other property of the polymer. Examples of such a monomer component include carboxyl-containing monomers such as acrylic acid, methacrylic acid, carboxyethyl(meth)acrylate, carboxypentyl(meth)acrylate, itaconic acid, maleic acid, fumaric acid, and crotonic acid; acid anhydride monomers such as maleic anhydride, and itaconic anhydride; hydroxyl-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, and (4-hydroxylmethylcyclohexyl)methyl(meth)acrylate; sulfonic acid group containing monomers such as styrenesulfonic acid, allylsulfonic acid, 2-(meth)acrylamide-2-methylpropanesulfonic acid, (meth)acrylamidepropanesulfonic acid, sulfopropyl(meth)acrylate, and (meth)acryloyloxynaphthalenesulfonic acid; phosphoric acid group containing monomers such as 2-hydroxyethylacryloyl phosphate; acrylamide; and acrylonitrile. These copolymerizable monomer components may be used alone or in combination of two or more thereof. The amount of the copolymerizable monomer(s) to be used is preferably 40% or less by weight of all the monomer components.

For crosslinking, the acrylic polymer can also contain multifunctional monomers if necessary as the copolymerizable monomer component. Such multifunctional monomers include hexane diol di(meth)acrylate, (poly)ethylene glycol di(meth)acrylate, (poly)propylene glycol di(meth)acrylate, neopentyl glycol di(meth)acrylate, pentaerythritol di(meth)acrylate, trimethylol propane tri(meth)acrylate, pentaerythritol tri(meth)acrylate, dipentaerythritol hexa(meth)acrylate, epoxy (meth)acrylate, polyester(meth)acrylate, urethane (meth)acrylate etc. These multifunctional monomers can also be used as a mixture of one or more thereof. From the viewpoint of adhesiveness etc., the use amount of the multifunctional monomer is preferably 30 wt % or less based on the whole monomer components.

Preparation of the above acryl polymer can be performed by applying an appropriate manner such as a solution polymerization manner, an emulsion polymerization manner, a bulk polymerization manner, and a suspension polymerization manner to a mixture of one or two or more kinds of component monomers for example. Since the adhesive layer preferably has a composition in which the content of low molecular weight materials is suppressed from the viewpoint of prevention of wafer contamination, and since those in which an acryl polymer having a weight average molecular weight of 300000 or more, particularly 400000 to 3000000 is as a main component are preferable from such viewpoint, the adhesive can be made to be an appropriate cross-linking type with an internal cross-linking manner, an external cross-linking manner, etc.

To increase the number-average molecular weight of the base polymer such as acrylic polymer etc., an external crosslinking agent can be suitably adopted in the adhesive. The external crosslinking method is specifically a reaction method that involves adding and reacting a crosslinking agent such as a polyisocyanate compound, epoxy compound, aziridine compound, melamine crosslinking agent, urea resin, anhydrous compound, polyamine, carboxyl group-containing polymer. When the external crosslinking agent is used, the amount of the crosslinking agent to be used is determined suitably depending on balance with the base polymer to be crosslinked and applications thereof as the adhesive. Generally, the crosslinking agent is preferably incorporated in an amount of about 5 parts by weight or less based on 100 parts by weight of the base polymer. The lower limit of the crosslinking agent is preferably 0.1 parts by weight or more. The adhesive may be blended not only with the components described above but also with a wide variety of conventionally known additives such as a tackifier, and aging inhibitor, if necessary.

The adhesive layer 2 can be formed from a radiation curing type adhesive. The adhesive power of the radiation curing type adhesive can be easily decreased by increasing the degree of crosslinking by irradiation with radiation such as an ultraviolet ray, and a difference in the adhesive power of one portion 2a from a different portion 2b can be provided by irradiating only the portion 2a that corresponds to the workpiece pasting portion of the adhesive layer 2 shown in FIG. 2.

The portion 2a in which the adhesive power is remarkably decreased can be easily formed by curing the radiation curing type adhesive layer 2 in conformity with the die bond film 3 shown in FIG. 2. Because the die bond film 3 is pasted to the portion 2a that is cured and has decreased adhesive power, the interface between the portion 2a of the adhesive layer 2 and the die bond film 3 has a property of easily peeling during pickup. On the other hand, the portion that is not irradiated with radiation has a sufficient adhesive power, and forms the portion 2b. A wafer ring can be fixed to the portion 2b.

An radiation curing type adhesive having an radiation curing type functional group such as a carbon-carbon double bond and exhibiting adherability can be used without special limitation. An example of the radiation curing type adhesive is an adding type radiation curing type adhesive in which radiation curing type monomer and oligomer components are compounded into a general pressure-sensitive adhesive such as an acrylic pressure-sensitive adhesive or a rubber pressure-sensitive adhesive.

Examples of the radiation curing type monomer component to be compounded include such as an urethane oligomer, urethane(meth)acrylate, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxypenta(meth)acrylate, dipentaerythritol hexa(meth)acrylate, and 1,4-butane dioldi(meth)acrylate. Further, the radiation curing type oligomer component includes various types of oligomers such as an urethane based, a polyether based, a polyester based, a polycarbonate based, and a polybutadiene based oligomer, and its molecular weight is appropriately in a range of about 100 to 30,000. The compounding amount of the radiation curing type monomer component and the oligomer component can be appropriately determined to an amount in which the adhesive strength of the adhesive layer can be decreased depending on the type of the adhesive layer. Generally, it is for example 5 to 500 parts by weight, and preferably about 40 to 150 parts by weight based on 100 parts by weight of the base polymer such as an acryl polymer constituting the adhesive.

Further, besides the added type radiation curing type adhesive described above, the radiation curing type adhesive includes an internal radiation curing type adhesive using an acryl polymer having a radical reactive carbon-carbon double bond in the polymer side chain, in the main chain, or at the end of the main chain as the base polymer. The internal radiation curing type adhesives of an internally provided type are preferable because they do not have to contain the oligomer component, etc. that is a low molecular weight component, or most of them do not contain, they can form a adhesive layer having a stable layer structure without migrating the oligomer component, etc. in the adhesive over time.

The above-mentioned base polymer, which has a carbon-carbon double bond, may be any polymer that has a carbon-carbon double bond and further has viscosity. As such a base polymer, a polymer having an acrylic polymer as a basic skeleton is preferable. Examples of the basic skeleton of the acrylic polymer include the acrylic polymers exemplified above.

The method for introducing a carbon-carbon double bond into any one of the above-mentioned acrylic polymers is not particularly limited, and may be selected from various methods. The introduction of the carbon-carbon double bond into a side chain of the polymer is easier in molecule design. The method is, for example, a method of copolymerizing a monomer having a functional group with an acrylic polymer, and then causing the resultant to condensation-react or addition-react with a compound having a functional group reactive with the above-mentioned functional group and a carbon-carbon double bond while keeping the ultraviolet ray curability of the carbon-carbon double bond.

Examples of the combination of these functional groups include a carboxylic acid group and an epoxy group; a carboxylic acid group and an aziridine group; and a hydroxyl group and an isocyanate group. Of these combinations, the combination of a hydroxyl group and an isocyanate group is preferable from the viewpoint of the easiness of reaction tracing. If the above-mentioned acrylic polymer, which has a carbon-carbon double bond, can be produced by the combination of these functional groups, each of the functional groups may be present on any one of the acrylic polymer and the above-mentioned compound. It is preferable for the above-mentioned preferable combination that the acrylic polymer has the hydroxyl group and the above-mentioned compound has the isocyanate group. Examples of the isocyanate compound in this case, which has a carbon-carbon double bond, include methacryloyl isocyanate, 2-methacryloyloxyethyl isocyanate, and m-isopropenyl-α,α-dimethylbenzyl isocyanate. The used acrylic polymer may be an acrylic polymer copolymerized with anyone of the hydroxyl-containing monomers exemplified above, or an ether compound such as 2-hydroxyethyl vinyl ether, 4-hydroxybutyl vinyl ether or diethylene glycol monovinyl ether.

The intrinsic type radiation curing type adhesive may be made only of the above-mentioned base polymer (in particular, the acrylic polymer), which has a carbon-carbon double bond. However, the above-mentioned radiation curing type monomer component or oligomer component may be incorporated into the base polymer to such an extent that properties of the adhesive are not deteriorated. The amount of the radiation curing type oligomer component or the like is usually 30 parts or less by weight, preferably from 0 to 10 parts by weight for 100 parts by weight of the base polymer.

In the case that the radiation curing type adhesive is cured with ultraviolet rays or the like, a photopolymerization initiator is incorporated into the adhesive. Examples of the photopolymerization initiator include α-ketol compounds such as 4-(2-hydroxyethoxy)phenyl(2-hydroxy-2-propyl)ketone, α-hydroxy-α,α'-dimethylacetophenone, 2-methyl-2-hydroxypropiophenone, and 1-hydroxycyclohexyl phenyl ketone; acetophenone compounds such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether compounds such as benzoin ethyl ether, benzoin isopropyl ether, and anisoin methyl ether; ketal compounds such as benzyl dimethyl ketal; aromatic sulfonyl chloride compounds such as 2-naphthalenesulfonyl chloride; optically active oxime compounds such as 1-phenone-1,1-propanedione-2-(o-ethoxycarbonyl) oxime; benzophenone compounds such as benzophenone, benzoylbenzoic acid, and 3,3'-dimethyl-4-methoxybenzophenone; thioxanthone compound such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphorquinone; halogenated ketones; acylphosphonoxides; and acylphosphonates. The amount of the photopolymerization initiator to be blended is, for example, from about 0.05 to 20 parts by weight for 100 parts by weight of the acrylic polymer or the like which constitutes the adhesive as a base polymer.

Examples of the radiation curing type adhesive include a rubber adhesive and an acrylic adhesive, that are disclosed in Japanese Patent Application Laid-Open No. 60-196956, containing an addition-polymerizable compound having two or more unsaturated bonds, a photopolymerizable compound such as alkoxysilane having an epoxy group, and a photopolymerization initiator such as a carbonyl compound, an organic sulfur compound, a peroxide, an amine, or an onium salt compound.

A coloring material can be added into the adhesive layer 2 instead of adding a coloring material to the base 1 or in addition to adding a coloring material to the base 1. The same coloring materials as those that are added to the base 1 can be used as a coloring material that is added to the adhesive layer 2. An example of the method of adding a coloring material is a method of dissolving or dispersing the coloring material into a adhesive composition solution.

When forming the adhesive layer 2 with the radiation curing type adhesive, a portion of the adhesive layer 2 may be irradiated with radiation so that the adhesive power of the portion 2a in the adhesive layer 2 becomes smaller than that of the different portion 2b.

An example of the method of forming the portion 2a on the adhesive layer 2 is a method of forming the radiation curing type adhesive layer 2 on the support base 1 and then curing the portion 2a by partially irradiating with radiation. The partial irradiation can be performed through a photo mask having a pattern that corresponds to a portion other than the portion 2a. Another example is a method of curing the portion 2a by irradiating with radiation in spots. The radiation curing type adhesive layer 2 can be formed by transferring the layer that is provided on a separator onto the support base 1. The partial curing with radiation can also be performed on the radiation curing type adhesive layer 2 that is provided on the separator.

When forming the adhesive layer 2 with the radiation curing type adhesive, the portion 2a in which the adhesive power is decreased can be formed by using the support base 1 in which the entire portion or one portion other than the portion that corresponds to the portion 2a of at least one surface of the support base 1 is shielded from light, forming the radiation curing type adhesive layer 2, and curing the portion 2a by irradiating the support base 1 and the adhesive layer 2 with radiation. The shielding material that serves as a photo mask on the support film can be produced by printing, vapor deposition, or the like. According to such a manufacturing method, the dicing film with a protecting film 10 can be efficiently manufactured.

When curing inhibition by oxygen occurs at irradiation with radiation, oxygen (air) is desirably shielded from the surface of the radiation curing type adhesive layer 2 by some method. Examples thereof include a method of covering the surface of the adhesive layer 2 with a separator and a method of performing irradiation with radiation such as an ultraviolet ray in a nitrogen gas atmosphere.

The thickness of the adhesive layer 2 is not especially limited. The thickness is preferably about 1 to 50 μm from the viewpoints of preventing chipping of a chip cut section, compatibility of fixing and holding of the adhesive layer, and the like. The thickness is preferably 2 to 30 μm and further preferably 5 to 25 μm.

Examples of the lamination structure of the die bond film 3 include a structure consisting of only a single layer of the adhesive layer and a multi-layered structure in which an adhesive layer is formed on one surface or both surfaces of a core material. Examples of the core material include a film such as a polyimide film, a polyester film, a polyethylene terephthalate film, a polyethylene naphthalate film, and a polycarbonate film, a resin substrate reinforced with glass fibers and plastic nonwoven fibers, a silicon substrate, and a glass substrate.

An example of the adhesive composition that constitutes the die bond film 3 is an adhesive composition in which a thermoplastic resin and a thermosetting resin are used together.

Examples of the above-mentioned thermosetting resin include phenol resin, amino resin, unsaturated polyester resin, epoxy resin, polyurethane resin, silicone resin, and thermosetting polyimide resin. These resins may be used alone or in combination of two or more thereof. Particularly preferable is epoxy resin, which contains ionic impurities which corrode semiconductor elements in only a small amount. As the curing agent of the epoxy resin, phenol resin is preferable.

The epoxy resin may be any epoxy resin that is ordinarily used as an adhesive composition. Examples thereof include bifunctional or polyfunctional epoxy resins such as bisphenol A type, bisphenol F type, bisphenol S type, brominated bisphenol A type, hydrogenated bisphenol A type, bisphenol AF type, biphenyl type, naphthalene type, fluorene type, phenol Novolak type, orthocresol Novolak type, tris-hydroxyphenylmethane type, and tetraphenylolethane type epoxy resins; hydantoin type epoxy resins; tris-glycicylisocyanurate type epoxy resins; and glycidylamine type epoxy resins. These may be used alone or in combination of two or more thereof. Among these epoxy resins, particularly preferable are Novolak type epoxy resin, biphenyl type epoxy resin, tris-hydroxyphenylmethane type epoxy resin, and tetraphenylolethane type epoxy resin, since these epoxy resins are rich in reactivity with phenol resin as an agent for curing the epoxy resin and are superior in heat resistance and so on.

The phenol resin is a resin acting as a curing agent for the epoxy resin. Examples thereof include Novolak type phenol resins such as phenol Novolak resin, phenol aralkyl resin, cresol Novolak resin, tert-butylphenol Novolak resin, phenol biphenyl resin and nonylphenol Novolak resin; resol type phenol resins; and polyoxystyrenes such as poly(p-oxystyrene). These may be used alone or in combination of two or more thereof. Among these phenol resins, phenol Novolak resin and phenol aralkyl resin are particularly preferable, since the connection reliability of the semiconductor device can be improved.

About the blend ratio between the epoxy resin and the phenol resin, for example, the phenol resin is blended with the epoxy resin in such a manner that the hydroxyl groups in the phenol resin is preferably from 0.5 to 2.0 equivalents, more preferably from 0.8 to 1.2 equivalents per equivalent of the epoxy groups in the epoxy resin component. If the blend ratio between the two is out of the range, curing reaction therebetween does not advance sufficiently so that properties of the cured epoxy resin easily deteriorate.

Examples of the thermoplastic resin include natural rubber, butyl rubber, isoprene rubber, chloroprene rubber, ethylene/vinyl acetate copolymer, ethylene/acrylic acid copolymer, ethylene/acrylic ester copolymer, polybutadiene resin, polycarbonate resin, thermoplastic polyimide resin, polyamide resins such as 6-nylon and 6,6-nylon, phenoxy resin, acrylic resin, saturated polyester resins such as PET and PBT, polyamideimide resin, and fluorine-contained resin. These thermoplastic resins may be used alone or in combination of two or more thereof. Of these thermoplastic resins, acrylic resin is particularly preferable since the resin contains ionic impurities in only a small amount and has a high heat resistance so as to make it possible to ensure the reliability of the semiconductor element.

The acrylic resin is not limited to any especial kind, and may be, for example, a polymer comprising, as a component or components, one or more esters of acrylic acid or methacrylic acid having a linear or branched alkyl group having 30 or less carbon atoms, in particular, 4 to 18 carbon atoms. Examples of the alkyl group include methyl, ethyl, propyl, isopropyl, n-butyl, t-butyl, isobutyl, amyl, isoamyl, hexyl, heptyl, cyclohexyl, 2-ethylhexyl, octyl, isooctyl, nonyl, isononyl, decyl, isodecyl, undecyl, lauryl, tridecyl, tetradecyl, stearyl, octadecyl, and dodecyl groups.

A different monomer which constitutes the above-mentioned polymer is not limited to any especial kind, and examples thereof include glycidyl-containing monomers such as glycidyl acrylate and glycidyl methacrylate; carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl (meth)acrylate, 10-hydroxydecyl(meth)acrylate, 12-hydroxylauryl(meth)acrylate, and (4-hydroxymethylcyclohexyl)methylacrylate; monomers which contain a sulfonic acid group, such as styrenesulfonic acid, allylsulfonic acid, 2-(meth)acrylamide-2-methylpropanesulfonic acid, (meth)acrylamidepropane sulfonic acid, sulfopropyl (meth)acrylate, and (meth)acryloyloxynaphthalenesulfonic acid; monomers which contain a phosphoric acid group, such as 2-hydroxyethylacryloyl phosphate; styrene monomer; and acrylonitril.

A filler can be appropriately compounded in the die bond film 3 according to the usage. The compounding of a filler enables the provision of electric conductivity, improvement of thermal conductivity, and adjustment of modulus of elasticity. Examples of the filler include inorganic fillers and organic fillers. An inorganic filler is preferable from the viewpoint of characteristics such as improvement of the handling property, improvement of thermal conductivity, adjustment of melt viscosity, and provision of a thixotropic property. The inorganic filler is not especially limited, and examples thereof include aluminum hydroxide, magnesium hydroxide, calcium carbonate, magnesium carbonate, calcium silicate, magnesium silicate, calcium oxide, magnesium oxide, aluminum oxide, aluminum nitride, aluminum borate whisker, boron nitride, crystalline silica, and amorphous silica. These can be used alone or two types or more can be used together. From the viewpoint of improvement of thermal conductivity, aluminum oxide, aluminum nitride, boron nitride, crystalline silica, and amorphous silica are preferable. From the viewpoint of a good balance of the characteristics, crystalline silica and amorphous silica are preferable. Further, a conductive substance (conductive filler) may be used as an inorganic filler for the provision of electric conductivity and improvement of thermal conductivity. Examples of the conductive filler include a metal powder in which silver, aluminum, gold, copper, nickel, or a conductive alloy is made into a sphere, a needle, or a flake; a metal oxide of alumina, and the like, amorphous carbon black, and graphite.

The compounded amount of the filler is preferably 5 parts by weight or more, more preferably 100 to 500 parts by weight, and further preferably 200 to 400 parts by weight to 100 parts by weight in total of the thermosetting resin component, the thermoplastic resin component, and the filler.

Other additives can be compounded in the die bond film 3 besides the filler as necessary. Examples of other additives include a flame retardant, a silane coupling agent, and an ion trap agent. Examples of the flame retardant include antimony trioxide, antimony pentoxide, and a brominated epoxy resin. These can be used alone or two types or more can be used together. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These compounds can be used alone or two types or more can be used together. Examples of the ion trap agent include hydrotalcites and bismuth hydroxide. These can be used alone or two types or more can be used together.

The thickness of the die bond film 3 (total thickness in a case of a laminated body) is not especially limited. However, it can be selected from a range of 1 to 200 μm, and is preferably 5 to 100 μm and more preferably 10 to 80 μm.

The protecting film 14 has a function as a protecting material to protect the die bond film 3 until it is put to use. The protecting film 14 can be used as a support base when the die bond film 3 is transferred to the adhesive layer 2. The protecting film 14 is peeled when a workpiece is adhered on the die bond film 3. Examples of the material of the protecting film 14 include polyethylene terephthalate (PET), polyethylene, polypropylene, and a plastic film and paper in which the surface is coated with a peeling agent such as a long chain alkylacrylate peeling agent.

The dicing film with a protecting film 10 according to the present embodiment can be produced as follows for example.

First, the base 1 is formed with a conventionally known film forming method. Examples of the film forming method include a calendar film forming method, a casting method in an organic solvent, an inflation extrusion method in a closed system, a T die extrusion method, a co-extrusion method, and a dry lamination method. When the base 1 is colored, the coloring material described above is added.

Then, a coating film is formed by applying a adhesive composition solution on the base 1, and then the coating film is dried (cross-linked by heating, if necessary) under a prescribed condition to form the adhesive layer 2. The coating method is not especially limited, and examples include roll coating, screen coating, and gravure coating. The drying can be performed under a drying condition of a drying temperature of 80 to 150° C. and a drying time of 0.5 to 5 minutes, for example. Further, a coating film may be formed by applying a adhesive composition on a separator, and dried under the drying condition to form the adhesive layer 2. When the adhesive layer 2 is colored, the coloring material described above is added. After that, the adhesive layer 2 is pasted to the base 1 together with the separator, thereby producing the dicing film 11.

The die bond film 3 is produced as follows for example.

First, an adhesive composition solution that is a forming material of the die bond film 3 is produced. The adhesive composition, the filler, various other additives, and the like are compounded in the adhesive composition solution, as described above.

Then, a coating film is formed by applying the adhesive composition solution on a base separator to a prescribed thickness, and the coating film is dried under a prescribed condition to form an adhesive layer. The coating method is not especially limited, and examples include roll coating, screen coating, and gravure coating. The drying can be performed in a drying condition of a drying temperature of 70 to 160° C. and a drying time of 1 to 5 minutes, for example. Further, a coating film may be formed by applying a adhesive composition on a separator, and dried under the drying condition to form the adhesive layer. After that, the adhesive layer is pasted to the base separator together with the separator.

Then, the separator is peeled from the dicing film 11 and the die bond film 3, and the die bond film 3 and the dicing film 11 are pasted to each other with the die bond film and the adhesive layer 2 being the pasting surface. Pasting can be performed by pasting with pressure for example. At this time, the lamination temperature is not especially limited. However, it is preferably 30 to 50° C., and more preferably 35 to 45° C. The line pressure is not especially limited. However, it is preferably 0.1 to 20 kgf/cm, and more preferably 1 to 10 kgf/cm. Next, the base separator on the die bond film 3 is peeled, and it pasted to the protecting film 14 to obtain a dicing film with a protecting film 10 according to the present embodiment. In the present embodiment, a long protective film 14 is used, and a plurality of the dicing films 11 (the dicing film 11 to which the die bond film 3 is pasted) are pasted to the protecting film 14 at prescribed intervals.

Figure 3:
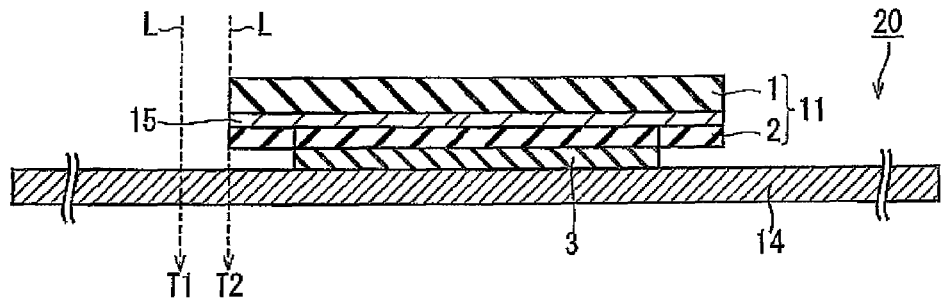
FIG. 3 is a schematic cross section view showing a dicing film with a protecting film according to another embodiment.

FIG. 3 is a schematic cross section view showing a dicing film with a protecting film according to another embodiment.

A printing layer 15 may be provided between the base 1 and the adhesive layer 2, like a dicing film with a protecting film 20 shown in FIG. 3. When the printing layer 15 is provided, the difference between the transmittance of only the protecting film 14 and the transmittance of the dicing film with a protecting film 20 including the dicing film 11 can be made to be more reliably 20% or more.

The printing layer 15 can be formed with a printing method such as a relief printing method, a lithographic printing method, an intaglio printing method, and a stencil printing method. The same coloring material (coloring agent) as described above can be used in the printing layer 15.

(Method of Manufacturing Semiconductor Device)

Figure 4:
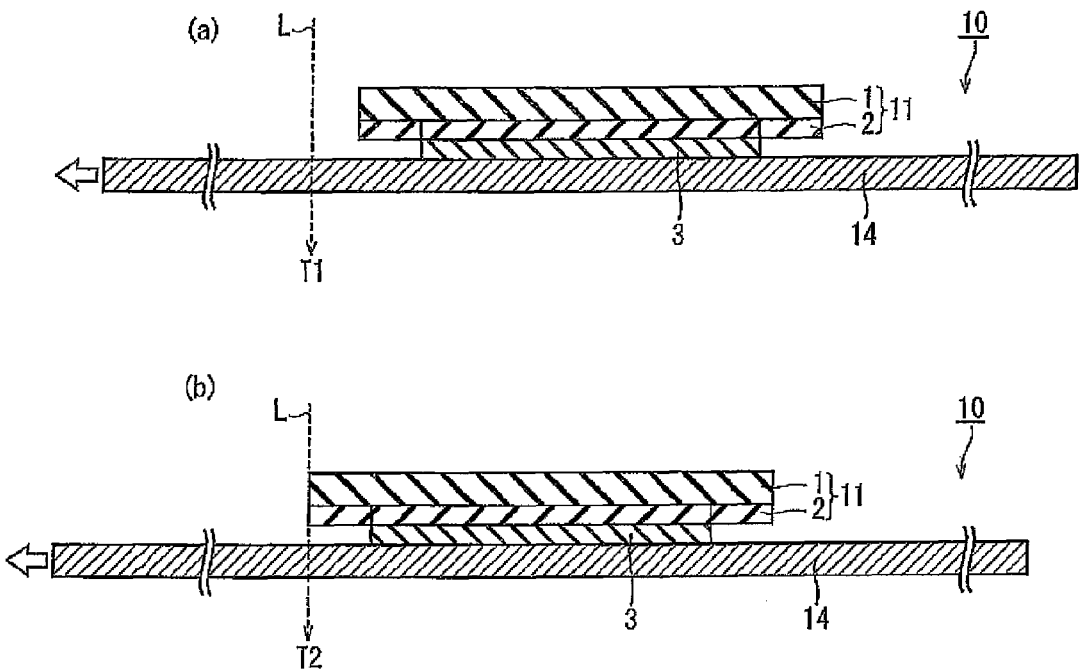
FIGS. 4A and 4B are schematic cross section views for explaining a method of manufacturing a semiconductor device according to the present embodiment.
Figure 5:
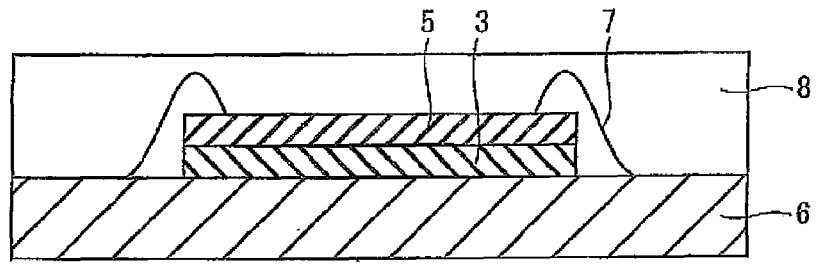
FIG. 5 is a schematic cross section view showing an example of mounting a semiconductor chip via an adhesive layer in the dicing films with a protecting film shown in FIGS. 1A, 1B, and 2.

Hereinafter, a method of manufacturing a semiconductor device will be explained using a case in which the dicing film with a protecting film 10 is used as an example with reference to FIGS. 4A and 4B, and FIG. 5. FIGS. 4A and 4B are schematic cross section views for explaining a method of manufacturing a semiconductor device according to the present embodiments. FIG. 5 is a schematic cross section view showing an example of mounting a semiconductor chip via an adhesive layer in the dicing films with a protecting film shown in FIGS. 1A, 1B, and 2.

As shown in FIG. 4A, the dicing film with a protecting film 10 is moved in a fixed direction (to the left in FIG. 4A), and the center portion in the width direction of the protecting film 14 is irradiated with light L for detecting a film. In FIG. 4A, the light L only transmits the protecting film 14, and the transmitted light L is detected by a sensor that is not shown in the drawing to calculate the transmittance. The transmittance at this time is the transmittance T1.

After that, when the dicing film with a protecting film 10 is further moved, the light L transmits the portion where the protecting film 14 and the dicing film 11 are laminated as shown in FIG. 4B. The transmitted light L is detected by a sensor that is not shown in the drawing to calculate the transmittance. The transmittance at this time is the transmittance T2.

The wavelength of the light for detecting a film is 600 to 700 nm, preferably 620 to 680 nm, and more preferably 640 to 660 nm.

The sensor determines that the dicing film 11 on the protecting film 14 is detected when the transmittance changes by 20% or more, that is, when the transmittance changes from the transmittance T1 to the transmittance T2. Then, the wafer mounting apparatus recognizes the position of the dicing film 11 based on this detection result, and peels the dicing film 11 from the protecting film 14 to paste the semiconductor wafer 4 with pressure (a pasting step). The present step is performed by pressing with a pressing device such as a press roll. The pasting temperature upon mounting is not especially limited, and it is preferably in a range of 20 to 80° C., for example. Because the difference between the transmittance T1 and the transmittance T2 is 20% or more in the present embodiment, the sensor can reliably recognize that the transmittance changes from the transmittance T1 of only the protecting film 14 to the transmittance T2 of a portion where the protecting film 14 and the dicing film 11 are laminated. As a result, it can be prevented that a non-detected dicing film is transferred and not used, and the downtime during this process can be eliminated. In addition, the dicing film can be pasted to the semiconductor wafer without a shift in position.

Next, dicing of the semiconductor wafer 4 is performed. With this operation, a semiconductor chip 5 is manufactured by cutting the semiconductor wafer 4 into an individual piece having a prescribed size (refer to FIG. 5). The dicing can be performed according to a normal method from the circuit surface side of the semiconductor wafer 4. A cutting method called full cut in which cutting is performed to the die bond film 3, for example, can be adopted in this step. The dicing apparatus used in this step is not especially limited, and a conventionally known apparatus can be used. Because the semiconductor wafer 4 is adhered and fixed to the dicing film 11 with the die bond film 3, chip cracks and chip fly can be suppressed and damages to the semiconductor wafer 4 can be suppressed.

Then, pickup of the semiconductor chip 5 is performed to peel off the semiconductor chip 5 that is adhered and fixed to the dicing film 11 with the die bond film 3. The method of pickup is not especially limited and various conventionally known methods can be adopted. An example is a method of pushing up the individual semiconductor chip 5 with a needle from the dicing film 11 side and picking up the semiconductor chip 5 that is pushed up with a pickup apparatus.

When the adhesive layer 2 is of ultraviolet-ray curing-type, pickup is performed after the adhesive layer 2 is irradiated with an ultraviolet ray. With this operation, the adhesive power of the adhesive layer 2 to the die bond film 3 decreases, and peeling of the semiconductor chip 5 becomes easy. As a result, pickup becomes possible without damaging the semiconductor chip 5. The conditions of ultraviolet ray irradiation such as the radiation intensity and the radiation time are not especially limited, and they may be set appropriately as necessary. The above-described light source can be used in the ultraviolet ray irradiation.

The semiconductor chip 5 that has been picked up is adhered and fixed to an adherend 6 interposing the die bond film 3 (die bonding). Examples of the adherend 6 include a lead frame, a TAB film, a substrate, and a semiconductor chip that is separately produced. The adherend 6 may be a deformation type adherend that can be easily deformed or a non-deformation type adherend that is difficult to be deformed such as a semiconductor wafer.

Conventionally known substrates can be used as the substrate. A metal lead frame such as a Cu lead frame or a 42 Alloy lead frame, or an organic substrate made of glass epoxy, BT (bismaleimide-triazine), or polyimide can be used as the lead frame. However, the present invention is not limited to these, and includes a circuit board that can be used by mounting the semiconductor element and electrically connecting to the semiconductor element.

When the die bond film 3 is a heat curing type, the semiconductor chip 5 can be adhered and fixed by heat curing to an adherend 6 to improve the heat resistance strength. The heating temperature is 80 to 200° C., preferably 100 to 175° C., and more preferably 100 to 140° C. The heating time is 0.1 to 24 hours, preferably 0.1 to 3 hours, and more preferably 0.2 to 1 hour. The semiconductor chip 5 that is adhered and fixed to a substrate or the like interposing the die bond film 3 can be used in a reflow step.

The shear adhering strength of the die bond film 3 after heat curing to the adherend 6 is preferably 0.2 MPa or more and more preferably 0.2 to 10 MPa. When the shear adhering strength of the die bond film 3 is at least 0.2 MPa or more, shear deformation due to the ultrasonic vibration and heating of a wire bonding step rarely occurs at the adhesion surface of the die bond film 3 and the semiconductor chip 5 or the adherend 6 in the step. That is, a semiconductor element rarely moves by the ultrasonic vibration during wire bonding, and thus a decrease of a success rate of wire bonding can be prevented.

In the method of manufacturing a semiconductor device according to the present embodiment, wire bonding may be performed without the thermal curing step by heat treatment of the die bond film 3, the semiconductor chip 5 may be sealed with a sealing resin, and then after curing of the sealing resin may be performed. In this case, the shear adhering strength of the die bond film 3 during temporary fixing to the adherend 6 is preferably 0.2 MPa or more, and more preferably 0.2 to 10 MPa. When the shear adhering strength of the die bond film 3 during temporary fixing is at least 0.2 MPa or more, shear deformation hardly occurs at the adhering surface of the die bond film 3 and the semiconductor chip 5 or the adherend 6 due to the ultrasonic wave vibration and heating in this step even when the wire bonding step is performed without the heating step. That is, the semiconductor element does not move much by the ultrasonic wave vibration during wire bonding, and accordingly, a decrease of the success rate of wire bonding can be prevented.

The wire bonding is a step of electrically connecting the tip of a terminal part (inner lead) of the adherend 6 and electrode pads (not shown in the drawings) on the semiconductor chip 5 with a bonding wire 7. Examples of the bonding wire 7 include a gold wire, an aluminum wire, and a copper wire. The temperature at wire bonding is 80 to 250° C. and preferably 80 to 220° C. The heating time is a few seconds to a few minutes. The wire bonding is performed by using vibration energy from an ultrasonic wave and pressure-bonding energy from the applied pressure while heating the wire to a temperature in the above-described temperature range. This step may be carried out without thermal curing of the die bond film 3.

The sealing step is a step of sealing the semiconductor chip 5 with a sealing resin 8. This step is performed to protect the semiconductor chip 5 that is mounted on the adherend 6 and the bonding wire 7. This step is performed by molding the resin for sealing with a mold. An example of the sealing resin 8 is an epoxy resin. The heating temperature during resin sealing is normally 175° C. and sealing is performed for 60 to 90 seconds. However, the present invention is not limited to this, and curing can be performed at 165 to 185° C. for a few minutes. With this operation, the sealing resin is cured and the semiconductor chip 5 and the adherend 6 are fixed interposing the die bond film 3. That is, in the present invention, fixing by the die bond film 3 is possible in this step even when the post curing step that is described later is not performed, which can contribute to a reduction of the number of manufacturing steps and a reduction of the manufacturing time of the semiconductor device.

In the post curing step, the sealing resin 8 that is not cured sufficiently in the sealing step is completely cured. Even when t the die bond film 3 is not completely thermally cured in the sealing step, complete thermal curing of the die bond film 3 together with the sealing resin 8 becomes possible in this step. The heating temperature in this step differs according to the type of sealing resin. The temperature is in a range of 165 to 185° C., and the heating time is about 0.5 to 8 hours.

In the above-described embodiment, a case is explained in which the diameter of the die bond film is smaller than that of the dicing film. However, the present invention is not limited to this case, and the diameter of the die bond film may be the same as or larger than that of the dicing film. In this case, the dicing film and the die bond film are laminated in a portion of the dicing film where the light for detecting a film transmits first. That is, the transmittance of the dicing film with a protecting film at the portion where the light for detecting a film transmits first corresponds to the transmittance of a laminated body of the protecting film, the dicing film, and the die bond film. The transmittance of the die bond film at a wavelength of 600 to 700 nm is preferably 50 to 80%. The difference between the transmittances of the die bond film and the dicing film is preferably 10% or more. The difference between the transmittances of the die bond film and the protecting film is preferably 10% or more.

In the above-described embodiment, a case is explained in which the difference between the transmittance T1 and the transmittance T2 is 20% or more because the entire dicing film 11 is colored, the printing layer 15 is provided in the entire dicing film 11, or embossing is performed on the entire surface of the base 1 of the dicing film 11. However, the present invention is not limited to this case, and any case is acceptable as long as the difference between the transmittance of the protecting film and the transmittance of the dicing film within a protecting film at a portion of the dicing film where the light for detecting a film transmits first is 20% or more. For example, the portion where the difference from the transmittance of the protecting film is 20% or more may be only a portion having a prescribed distance (for example, 100 to 500 µm) along a transferring direction of the film from a portion of the dicing film where the light for detecting a film transmits first (for example the portion 17 in FIGS. 1A and 1B). In this case, the portion where the difference in transmittances is 20% or more may be colored.

EXAMPLES

Below, preferred examples of the present invention are explained in detail. However, materials, addition amounts, and the like described in these examples are not intended to limit the scope of the present invention, and are only examples for explanation as long as there is no description of limitation in particular. Further, "part" means "parts by weight."

(Production of Adhesive Layer of Dicing Film)

Seventy parts of butylacrylate, 30 parts of ethylacrylate, and 5 parts of acrylic acid were copolymerized in ethylacetate with a normal method to obtain an acrylic polymer having a weight average molecular weight of 800,000. Next, 8 parts of a multi-functional epoxy compound (TETRAD-C manufactured by Mitsubishi Gas Chemical Company) as a crosslinking agent and 7 parts of 1-hydroxycyclohexylphenylketone as a photopolymerization initiator were compounded into 100 parts of the acrylic polymer, and they were uniformly dissolved in toluene as an organic solvent to obtain an acrylic adhesive composition solution having a concentration of 30% by weight. This acrylic adhesive composition solution was applied onto the surface of the base of each Example and each Comparative Example shown in Tables 1 and 2 to a thickness of 10 µm, and it was dried at 120° C. for 3 minutes. After that, only a portion where the semiconductor wafer was pasted was irradiated with an ultraviolet ray at 500 mJ/cm² through a mask to obtain a dicing film in which the portion where the semiconductor wafer was pasted was cured with an ultraviolet ray. The base (PP (polypropylene)) according to Example 1 was "FVHK-LB#40 N100" manufactured by Futamura Chemical Co., Ltd. The base (PP (polypropylene)) according to Example 2 was "FVHK-LB#40 S-400X" manufactured by Futamura Chemical Co., Ltd. The base (PO (polyolefin)) according to Example 3 is "TPX" manufactured by Mitsui Chemicals, Inc. The base (PVC (polyvinylchloride)) according to Example 4 is "SPV-M4001" manufactured by Nitto Denko Corporation. The base (PVC (polyvinylchloride)) according to Example 5 is "SPV-320" manufactured by Nitto Denko Corporation. The base (PET (polyethylene terephthalate)) according to Comparative Example 1 is "MRA-38" manufactured by Mitsubishi Plastics, Inc. The base (PET (polyethylene terephthalate)) according to Comparative Example 2 is "MRF-50" manufactured by Mitsubishi Plastics, Inc.

(Production of Die Bond Film)

The following (a) to (d) were dissolved into methylethylketone to obtain an adhesive composition solution having a concentration of 23.6% by weight.

(a) 32 parts by weight of an epoxy resin (Epicoat 1004 manufactured by Japan Epoxy Resin Co., Ltd.)

(b) 34 parts by weight of a phenol resin (Milex XLC-4L manufactured by Mitsui Chemicals, Inc.)

(c) 100 parts of an acrylic ester polymer having ethylacrylate-methylmethacrylate as a main component (SG-708-6 manufactured by Nagase ChemteX Corporation)

(d) 110 parts of spherical silica (SO-25R manufactured by Admatechs Co., Ltd.)

This adhesive composition solution was applied onto a releasing treatment film (a peeling liner) consisting of a polyethylene terephthalate film and having a thickness of 100 µm in which a silicone releasing treatment was performed, and it was dried at 120° C. for 3 minutes, thereby producing a die bond film having a thickness of 10 µm.

(Production of Dicing Film with Protecting Film)

The dicing film of each of Examples and Comparative Examples was cut into a circle having a diameter of 370 mm. Next, the die bond film was cut into a circle having a diameter of 320 mm, and transferred to each dicing film. The transfer was performed so that the adhesive layer of the dicing film faced to the die bond film. After that, the protecting film of a polyethylene terephthalate film having a thickness of 35 µm in which a silicone releasing treatment was performed was pasted to the die bond film side to obtain the dicing films with a protecting film of the present Examples and Comparative Examples.

(Measurement of Transmittance)

The measurement of the transmittance was performed at a measurement mode of %T (transmittance measurement) and a measurement wavelength range of 190 to 800 nm using a spectrophotometer (V-670) manufactured by JASCO Corporation. The transmittance at a wavelength of 650 nm was made to be a measurement value. As a result, the transmittance of the protecting film at a wavelength of 650 nm was 88.8%. The transmittance (%) of the dicing film at a wavelength of 650 nm and the transmittance (%) of a portion where the protecting film and the dicing film are laminated were as shown in Tables 1 and 2. The difference between the transmittance of the protecting film and the transmittance of a portion where the protecting film and the dicing film are laminated is also shown in Tables 1 and 2.

(Sensor Recognizability)

A sensor that detects the dicing film on the protecting film and a wafer mounting apparatus in which the detected dicing film is peeled from the protecting film to paste a semiconductor wafer were used to perform a sensor recognizability test. The case in which the sensor recognized the dicing film and wafer mounting was performed was marked ○, and the case in which the dicing film was not recognized and wafer mounting was not performed was marked x. The result is shown in Tables 1 and 2.

<Sensor Condition>
Sensor: LV-11SB manufactured by KEYENCE Corporation
Sensor head: Linear light retro-reflective type (model: LV-S62)
Detection distance: 50 mm <Pasting Condition>
Pasting apparatus: MA-3000III manufactured by Nitto Seiki Co., Ltd.
Pasting speed: 10 mm/sec
Movement speed: 10 mm/sec (Haze Value)

The haze value was measured on the base of Example 3. The measurement of the haze value was performed with a haze meter (NDH2000 manufactured by Nippon Denshoku Industries Co., Ltd.).

$$\text{Haze Value (\%)} = T_d/T_t \times 100$$

$T_d$: Diffuse transmittance
$T_t$: Total light transmittance
The result is shown in Table 1.

TABLE 1

| | | Example 1 | Example 2 | Example 3 | Example 4 | Example 5 |
|---|---|---|---|---|---|---|
| BASE OF DICING FILM | COMPOSITION (LAYER CONFIGURATION) | PP | PP | PO | PVC | PVC |
| | COLOR | TRANSPARENT | SEMI-TRANSPARENT | SEMI-TRANSPARENT | WHITE | WHITE |
| | EMBOSSING | NONE | NONE | HAZE VALUE 50% | NONE | NONE |
| | THICKNESS (μm) | 40 | 40 | 50 | 100 | 30 |
| TRANSMITTANCE (%) OF DICING FILM | | 69.8 | 36.5 | 40.4 | 0.3 | 0.2 |
| TRANSMITTANCE (%) OF PORTION WHERE PROTECTING FILM AND DICING FILM ARE LAMINATED | | 67.2 | 35.3 | 39.5 | 0.3 | 0.2 |
| DIFFERENCE IN TRANSMITTANCES (%) | | 21.6 | 53.5 | 49.3 | 88.5 | 88.6 |
| SENSOR RECOGNIZABILITY | | ○ | ○ | ○ | ○ | ○ |

TABLE 2

| | | COMPARATIVE EXAMPLE 1 | COMPARATIVE EXAMPLE 2 |
|---|---|---|---|
| BASE OF DICING FILM | COMPOSITION (LAYER CONFIGURATION) | PET | PET |
| | COLOR | TRANSPARENT | TRANSPARENT |
| | EMBOSSING | NONE | NONE |
| | THICKNESS (μm) | 38 | 50 |
| TRANSMITTANCE (%) OF DICING FILM | | 85.4 | 78.6 |
| TRANSMITTANCE (%) OF PORTION WHERE PROTECTING FILM AND DICING FILM ARE LAMINATED | | 83.1 | 76.9 |
| DIFFERENCE IN TRANSMITTANCES (%) | | 5.7 | 11.9 |
| SENSOR RECOGNIZABILITY | | X | X |

(Result)

As seen from the result of Tables 1 and 2, the dicing film can be recognized by a sensor when the difference between the transmittance of the portion where the protecting film and the dicing film are laminated and the transmittance of the protecting film is 20% or more.

What is claimed is:

1. A method of manufacturing a semiconductor device comprising:

providing a dicing film with a protecting film in which a dicing film and a protecting film are laminated, wherein the difference between the transmittance of the protecting film and the transmittance of the dicing film with a protecting film at a portion of the dicing film where light for detecting a film transmits first is 20% or more in a wavelength of 600 to 700 nm;

moving the dicing film with a protecting film in a fixed direction;

irradiating light for detecting a film onto the dicing film with a protecting film;

detecting transmitted light indicative of a location where the protecting film and the dicing film are laminated;

recognizing the position of the dicing film based on the detection result;

peeling the die bond film from the protecting film;

pasting a semiconductor wafer to the die bond film; and dicing the semiconductor wafer.

2. The method of manufacturing a semiconductor device according to claim 1, further comprising:

picking up a semiconductor chip of the diced semiconductor wafer;

adhering the semiconductor chip to an adherend;

wire bonding the adhered semiconductor chip; and sealing the wire-bonded semiconductor chip with a sealing resin.

* * * * *

UNITED STATES PATENT AND TRADEMARK OFFICE
CERTIFICATE OF CORRECTION

PATENT NO.        : 8,614,139 B2
APPLICATION NO.   : 13/415524
DATED             : December 24, 2013
INVENTOR(S)       : Shishido et al.

It is certified that error appears in the above-identified patent and that said Letters Patent is hereby corrected as shown below:

In the Specification

Column 4 line 13, Change "unstreched," to --unstretched,--.

Column 8 line 13, Change "dioldi" to --diol di--.

Column 12 line 15, Change "acrylonitril." to --acrylonitrile.--.

Signed and Sealed this
Twenty-sixth Day of August, 2014

Michelle K. Lee
*Deputy Director of the United States Patent and Trademark Office*